(12) United States Patent
Mansir et al.

(10) Patent No.: US 12,724,074 B2
(45) Date of Patent: Sep. 1, 2026

(54) ELECTROMOTIVE FORCE (EMF) MONITORING FOR AN ELECTRICAL SUBMERSIBLE PUMP (ESP) WITH PERMANENT MAGNET MOTOR (PMM)

(71) Applicant: Halliburton Energy Services, Inc., Houston, TX (US)

(72) Inventors: Hassan Mansir, Frimley (GB); John Badawi, Frimley (GB); Richard Joseph Delaloye, Houston, TX (US); Tom Yohanan, Tulsa, OK (US)

(73) Assignee: Halliburton Energy Services, Inc., Houston, TX (US)

( * ) Notice: Subject to any disclaimer, the term of this patent is extended or adjusted under 35 U.S.C. 154(b) by 221 days.

(21) Appl. No.: 18/535,702

(22) Filed: Dec. 11, 2023

(65) Prior Publication Data

US 2025/0189585 A1 Jun. 12, 2025

(51) Int. Cl.

| | |
|---|---|
| ***G01R 31/34*** | (2020.01) |
| ***G01R 19/165*** | (2006.01) |
| ***G08B 7/06*** | (2006.01) |
| ***G08B 21/18*** | (2006.01) |
| *E21B 43/12* | (2006.01) |

(52) U.S. Cl.

CPC ..... *G01R 31/343* (2013.01); *G01R 19/16533* (2013.01); *G08B 7/06* (2013.01); *G08B 21/185* (2013.01); *E21B 43/128* (2013.01)

(58) Field of Classification Search

CPC .. G01R 31/343; G01R 19/16533; G08B 7/06; G08B 21/185

See application file for complete search history.

(56) References Cited

U.S. PATENT DOCUMENTS

| | | | | |
|---|---|---|---|---|
| 8,041,165 | B2 * | 10/2011 | Neuroth | G02B 6/502 385/101 |
| 9,255,457 | B2 * | 2/2016 | Scarsdale | E21B 43/128 |
| 10,263,561 | B2 * | 4/2019 | Huh | F04D 13/10 |
| 11,414,967 | B2 * | 8/2022 | Janger | H02P 6/28 |
| 2018/0097466 | A1 | 4/2018 | Huh et al. | |
| 2019/0063210 | A1 * | 2/2019 | Coste | F04D 15/0077 |

(Continued)

OTHER PUBLICATIONS

"PCT Application No. PCT/US2023/083465 International Search Report and Written Opinion", Aug. 27, 2024, 9 pages.

(Continued)

*Primary Examiner* — Arleen M Vazquez

(74) *Attorney, Agent, or Firm* — DeLizio, Peacock, Lewin and Guerra, LLP

(57) ABSTRACT

Systems, methods, and apparatus, including computer programs encoded on computer-readable media, for monitoring an electromotive force (EMF) for an electrical submersible pump (ESP) having a permanent magnet motor (PMM) are disclosed. One or more voltages and one or more currents may be monitored in a cable coupled to the ESP having the PMM and being used in a well system. It may be determined whether at least one of the one or more voltages in the cable exceeds a voltage threshold and whether at least one of the one or more currents in the cable exceeds a current threshold. A notification may be generated to indicate an EMF condition if at least one of the one or more voltages and the one or more currents in the cable exceeds at least one of the one or more thresholds.

21 Claims, 4 Drawing Sheets

(56) References Cited

U.S. PATENT DOCUMENTS

| | | | | |
|---|---|---|---|---|
| 2021/0013713 | A1* | 1/2021 | Douglas | H02H 9/045 |
| 2021/0025381 | A1 | 1/2021 | Orfanoudakis et al. | |
| 2021/0062803 | A1 | 3/2021 | Yuratich et al. | |
| 2023/0167693 | A1 | 6/2023 | Leismer et al. | |
| 2023/0184071 | A1 | 6/2023 | Janger et al. | |
| 2023/0231505 | A1* | 7/2023 | Li | H02P 3/22 318/445 |
| 2023/0296015 | A1* | 9/2023 | Lastra Melo | E21B 47/008 166/250.15 |
| 2024/0027646 | A1* | 1/2024 | Olsson | H04R 1/1041 |

OTHER PUBLICATIONS

"Permanent Magnet Motor Safety", API recommended practice 11S9, First Edition, Mar. 2023, 115 pages.

Badawi, et al., "PMM Use in Electrical Submersible Pump (ESP) Oil Production Systems—Safety Review", COREteQ Systems Limited, American Petroleum Institue RP11S9, Mar. 12, 2020, 12 pages.

* cited by examiner

ELECTROMOTIVE FORCE (EMF) MONITORING FOR AN ELECTRICAL SUBMERSIBLE PUMP (ESP) WITH PERMANENT MAGNET MOTOR (PMM)

TECHNICAL FIELD

The present invention relates generally to oil and gas systems and services, and more specifically to monitoring electromotive force (EMF) for electrical submersible pumps (ESPs) with permanent magnet motors (PMMs).

BACKGROUND

The oil and gas services industry uses various types of downhole well devices or tools in well systems. For example, well systems may use electrical submersible pumps (ESPs) with permanent magnet motors (PMMs). PMM technology provides constant torque characteristics, high efficiencies, and compactness when compared to traditional induction motors. In PMMs, a rotor magnetic field is present even when no electric current is being supplied to its windings. This means that the motor windings generate an electromotive force (EMF) every time the motor rotor is rotated, whether or not it is energized by an external source of electrical energy. The EMF can be lethal to the personnel at the well site, and if the personnel are not aware of the EMF conditions, the EMF conditions will not be recognized and mitigated. An ESP can be driven, and the motor rotated unpowered, during deployment, retrieval, when the well is injected, and soon after shutdown when the fluid in the column flows back to the formation. Therefore, the potential EMF related safety issues to the well site personnel need to be actively monitored and mitigated. The typical safety method of deployment or retrieval for a PMM-based ESP is to eliminate the risk of unintended rotation, which can result in EMF conditions in the cables and equipment that are electrically connected to the ESP.

DESCRIPTION

The description that follows includes example systems, methods, techniques, and program flows that describe aspects of the disclosure. However, it is understood that this disclosure may be practiced without these specific details. For instance, this disclosure refers to certain well systems, devices, or tools in illustrative examples. Aspects of this disclosure can be instead applied to other types of well systems, devices, and tools. In other instances, well-known instruction instances, protocols, structures, and techniques have not been shown in detail to avoid confusion.

Figure 1:
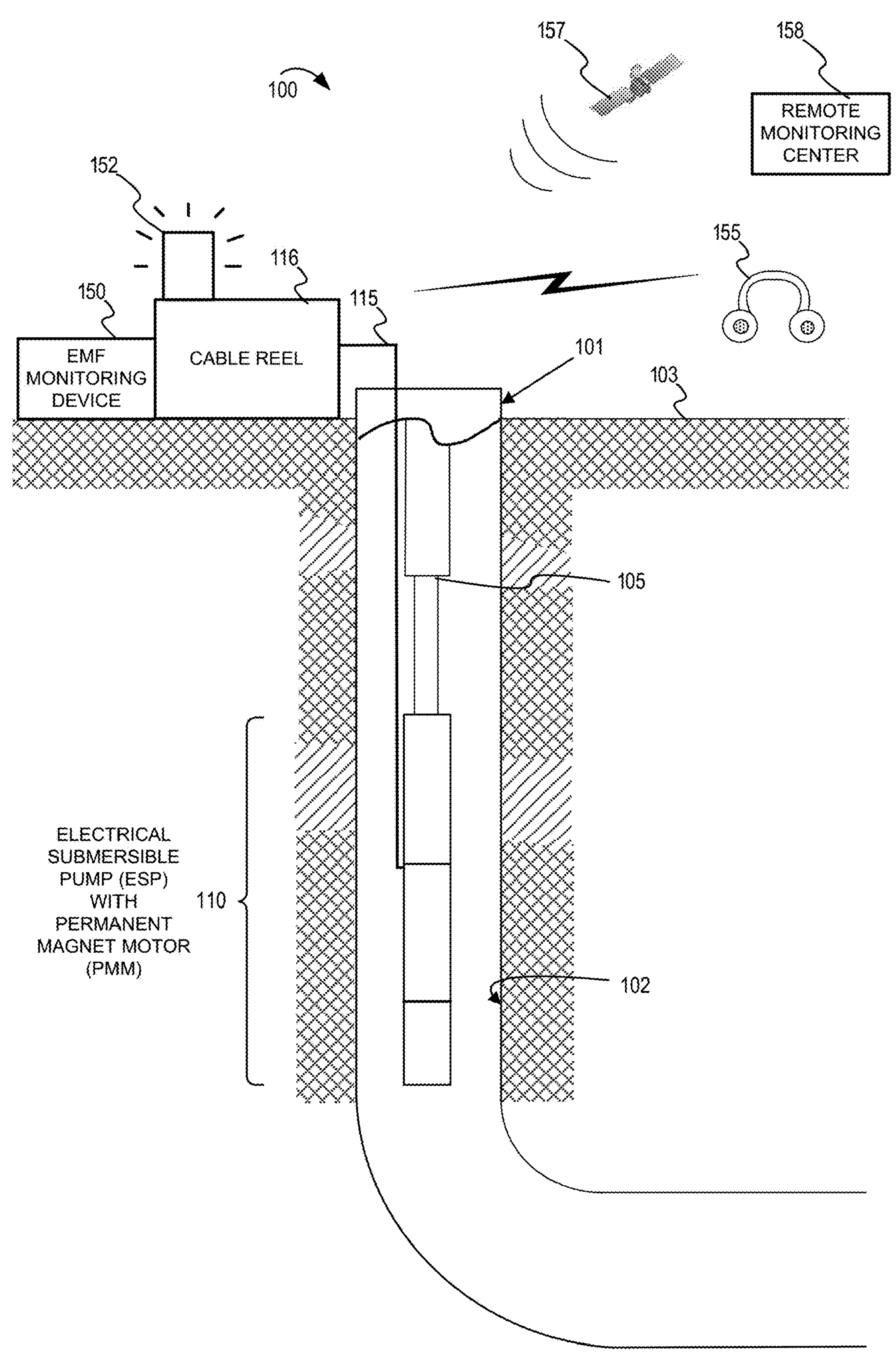
FIG. 1 depicts a schematic diagram of an example well system including an electromotive force (EMF) monitoring device for an electrical submersible pump (ESP) that uses a permanent magnet motor (PMM), according to some implementations.

FIG. 1 depicts a schematic diagram of an example well system 100 including an electromotive force (EMF) monitoring device 150 for an electrical submersible pump (ESP) 110 that uses a permanent magnet motor (PMM), according to some implementations. In some implementations, the well system 100 may include the well 101, the casing 102, the well tubing 105 (such as tubing of a work string or production tubing), the ESP 110, the ESP cable 115, the cable reel 116, and the EMF monitoring device 150. It is noted that the well system 100 may include additional surface equipment, well devices and well tools that are not shown for simplicity. In some implementations, the ESP 110 may be coupled to the well tubing 105, and the ESP cable 115 may be coupled to the ESP 110. The ESP cable 115 may also be referred to as a cable or a power cable. The ESP cable 115 and ESP 110 may be lowered into the well 101, and the ESP cable 115 can provide power to the ESP 110 (and optionally to other downhole tools or devices that are part of the well tubing 105). In some implementations, the EMF monitoring device 150 may be attached or connected to the cable reel 116. It is noted, however, that in other implementations the EMF monitoring device 150 can be connected or attached to any other surface equipment at the surface 103, the EMF monitoring device 150 can be a stand-alone apparatus, or the EMF monitoring device 150 can be implemented within other surface equipment (e.g., can be integrated as part of other surface equipment or computer systems).

In some implementations, the EMF monitoring device 150 is configured to continuously monitor the voltage and current in the ESP cable 115 coupled to the ESP 110, and alert or notify personnel (e.g., located at the well site or in a remote location) of an EMF condition. For example, during deployment, installation, operation, after shutdown, and during removal of the ESP 110, the EMF monitoring device 150 may continuously measure and monitor the voltage and current in the ESP cable 115. The EMF monitoring device 150 can continuously monitor the presence of EMF from the voltage and/or current measurements, as further described below in FIG. 2. The voltage and/or current measurements can detect an EMF event that is caused by various well conditions, such as the unintended rotation of the PMM of the ESP 110, a short in the ESP cable 115, the ESP cable 115 not being grounded properly, and/or the ESP cable 115 being compromised, among others. In some implementations, the EMF monitoring device 150 may also monitor an electrical resistance to perform an electrical health check and monitor the integrity of the ESP cable 115. In some implementations, when an EMF condition is detected, the EMF monitoring device 150 can generate a notification to notify or alert the personnel of the EMF condition, as further described below. In some implementations, the EMF monitoring device 150 can also notify personnel when it is safe to resume normal well operations.

In some implementations, the EMF monitoring device 150 may notify the well site personnel via an audible and visual alert or notification. For example, the EMF monitoring device 150 may notify the well site personnel via a strobe light 152 (or other type of visual and/or audible alert) and a headset 155 (audible alert). It is noted that in other implementations the EMF monitoring device 150 can notify the personnel by various other mechanisms, such as by a siren, alarm, vibrations (or other tactile notification) on the headset, and any other alert or notification that may be located at the EMF monitoring device 150 or any other surface equipment at the well site. In some implementations, the EMF monitoring device 150 may generate a wired or wireless signal that can notify or alert the well site and/or remote personnel of the EMF condition. For example, as described above, a wired signal may be generated and transmitted to the strobe light 152 and a wireless signal (e.g., Wi-Fi, Bluetooth, or the like) may be generated and transmitted to the headset 155 to alert the well site personnel. As another example, in addition to (or instead of) the audible and/or visual alerts or notifications for the well site personnel described above, the EMF monitoring device 150 may generate a wired signal (e.g., via the Ethernet) and/or a wireless signal (e.g., via a cellular system or a global positioning system (GPS)) to alert or notify a remote monitoring center 158. For example, the EMF monitoring device 150 may provide a wireless signal to the satellite 157 to alert the remote monitoring center 158. In some implementations, in addition to notifying of the EMF condition, the EMF monitoring device 150 may automatically mitigate or take remedial actions to shut down well operations that may be contributing to the EMF condition. For example, the EMF monitoring device 150 may interface with the cable reel 116 or other surface equipment to lock out the cable reel 116 and stop well operations, such as the deployment and installation operations (e.g., Run in Hole (RIH)) or the removal operations (e.g., Pull Out of Hole (POOH)) of the ESP 110. In some implementations, if the power of the well system 100 is on and/or there are other operations taking place, the EMF monitoring device 150 may automatically shut down the power and stop any ongoing well operations.

In some implementations, the EMF monitoring device 150 may monitor for EMF based on the voltage and/or current measurements by comparing the measurements to one or more thresholds. For example, the EMF monitoring device 150 may determine whether one or more measured voltages exceed a voltage threshold, and whether one or more measured currents exceed a current threshold, as further described below in FIG. 2. An EMF condition in the well systems may be detected if the voltages and/or the current exceed one or more of the thresholds.

Although an example well systems 100 is shown in FIG. 1, it is noted that the well system having the EMF monitoring device 150 may be any type of well system. For example, the well systems may be any type of drilling well systems, completion well systems, and producing well systems.

Figure 2:
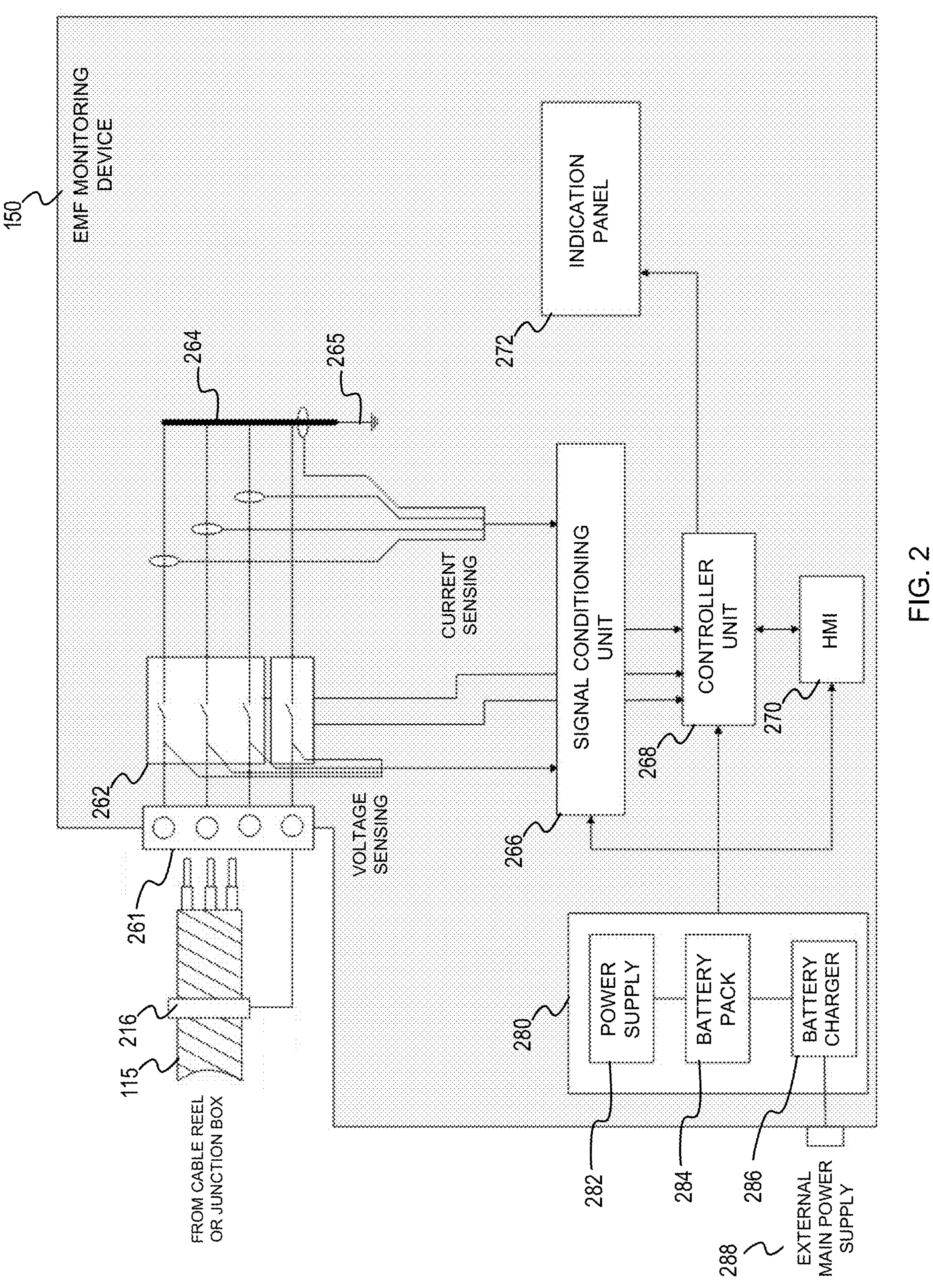
FIG. 2 depicts a schematic diagram of an example EMF monitoring device for monitoring EMF conditions in a well system that uses a PMM-based ESP, according to some implementations.

FIG. 2 depicts a schematic diagram of an example EMF monitoring device 150 for monitoring EMF conditions in a well system that uses a PMM-based ESP, according to some implementations. The EMF monitoring device 150 may be connected to a PMM-based ESP (such as the ESP 110 shown in FIG. 1) via the ESP cable 115. As shown in FIG. 2, in some implementations, the EMF monitoring device 150 may include an input connector 261, a shorting circuit breaker 262, a shorting bus bar 264, a signal conditioning unit 266, a controller unit 268, a human-machine interface (HMI) 270, an indication panel 272, and power module 280. In some implementations, the power module 280 may include a power supply 282, a battery pack 284, and a battery charger 286. In some implementations, the ESP cable 115 may connect to the EMF monitoring device 150 via the connector 261, and the power module 280 may connect to an external main power source 288. In some implementations, the ESP cable 115 may include a cable armor grounding strap 216 that is connected to ground.

In some implementations, the ESP cable 115 may be terminated and connected to the input connector 261. In one example, the input connector 261 may be a spring loaded, quick attach/detach connector. In one example, the cable armor grounding strap 216 of the ESP cable 115 may also be connected to the input connector 261 in order to ground the ESP cable 115. The input connector 261 may be connected to the shorting circuit breaker 262. The shorting circuit breaker 262 may be used to measure the voltages across the conductors of the ESP cable 115. In one example, the ESP cable 115 may be a three-phase cable and the shorting circuit breaker 262 may be used to open the conductors of the three-phase cable and the cable armor grounding strap 216. In some implementations, the voltages of the three-phase cable (e.g., the ESP cable 115) and cable armor grounding strap 216 can be monitored by the EMF monitoring device 150 via the input connector 261 when the conductors are open. In some implementations, to measure the current in the ESP cable 115, the shorting circuit breaker 262 is closed to connect the conductors of the three-phase cable (e.g., the ESP cable 115) and cable armor grounding strap 216 to the shorting bus bar 264 and the local ground 265. The voltages and currents may be detected or received by the signal conditioning unit 266. In some implementations, the signal conditioning unit 266 may detect or receive the voltages via voltage sensors or a voltage transformer when the shorting circuit breaker 262 opens the conductors, and the signal conditioning unit 266 may detect or receive the currents via current sensors or a current transformer when the shorting circuit breaker 262 closes the conductors to connect to the shorting bus bar 264 and the local ground 265.

In some implementations, the signal conditioning unit 266 may obtain the voltage and/or current signals and may isolate and condition the signals for prepare for processing by the controller unit 268. For example, the signal conditioning unit 266 may convert the raw analog signals into digital form. Also, the signal conditioning unit 266 may receive high voltage and high current signals, and thus may scale and condition the signals to lower levels such that they can be processed by the controller unit 268. After isolating and conditioning the voltage and current signals, the signal conditioning unit 266 may provide the signals to the controller unit 268 for processing. The shorting circuit breaker 262, the shorting bus bar 264, and the signal conditioning unit 266 may be referred to as sensing devices or voltage and current sensing devices.

In some implementations, the controller unit 268 may receive the conditioned signals from the signal conditioning unit 266 and further process the voltage and current signals to derive the voltage and current measurements. For example, the controller unit 268 may process the signals using one or more processors and memory, as further shown in FIG. 4. In some implementations, the controller unit 268 may determine whether the voltage and current measurements exceed one or more thresholds. In some implementations, the controller unit 268 may determine whether the one or more voltage measurements exceed a voltage threshold. For example, a first voltage may be monitored and measured between a first terminal/conductor (referred to as A) of the ESP cable 115 and a second terminal conductor (referred to as B) of the ESP cable 115, a second voltage may be monitored and measured between A and a third terminal/conductor (referred to as C) of the ESP cable 115, a third voltage may be monitored and measured between B and C, a fourth voltage may be monitored and measured between A and a ground terminal (referred to as G) of the ESP cable 115, a fifth voltage may be monitored and measured between B and G, and a sixth voltage may be monitored and measured between C and G. In some implementations, the voltage threshold may be 25V at 1 Hz. It is noted, however, that the voltage threshold may vary in different implementations. In one example, the voltage threshold may be set at any value between 20V and 25V. In another example, the voltage threshold may be set at any value between 20V and 30V. Furthermore, the controller unit 268 may determine whether one or more current measurements exceed a current threshold. For example, a first current may be monitored and measured in A, a second current may be monitored and measured in B, a third current may be monitored and measured in C, and a fourth current may be monitored and measured in G. In some implementations, the current threshold may be 100 mA at 1 Hz. It is noted, however, that the current threshold may vary in different implementations. In one example, the current threshold may be set at any value between 50 mA and 100 mA. In another example, the voltage threshold may be set at any value between 30 mA and 120 mA. In some implementations, the components of the EMF monitoring device 150 may continuously monitor and compare the voltages and currents with the corresponding thresholds during deployment and installation (e.g., Run in Hole (RIH)), operation, after shutdown, and during removal (e.g., Pull Out of Hole (POOH)) of the ESP 110.

In some implementations, the controller unit 268 may generate a notification to indicate an EMF condition if the one or more voltage measurements exceed the voltage threshold and/or if the one or more current measurements exceed the current threshold. In implementations, the controller unit 268 may generate a notification signal that is transmitted to the indication panel 272. The signal notification may cause the indication panel 272 to trigger one or more visual and audible notifications or alerts. For example, after receiving the signal notification of an existing EMF condition from the controller unit 268, the indication panel 272 may send a wired or wireless signal (e.g., Ethernet, cable, Wi-Fi or Bluetooth, among others) to one or more strobe lights, LED lights, sirens, alarms, or other visual and/or audible alerting device at the well site to cause the alerting device to visually and/or audibly alert or notify the well site personnel of the detected EMF condition. The indication panel 272 may also send a wireless signal to a headset being worn by well site personnel to provide an audible alert and/or to cause the headset to vibrate (or give another type of alert or indication). The indication panel 272 may also send a wireless signal to other portable devices, such as a mobile phone, a smart device, a FOB, or other wireless device. In some implementations, the indication panel 272 may provide a wired signal (e.g., via the Ethernet) and/or a wireless signal (e.g., via a cellular system, a global positioning system (GPS) or any other network) to alert or notify a remote monitoring center of the EMF condition. The wireless and/or wired signals may be provided or streamed in real-time to the remote monitoring center. In some implementations, the data stream sample rates and registers associated with the signals and other data transmitted or streamed to the remote monitoring center may be user configurable. In some implementations, in addition to generating notifications or alerts of the EMF condition, the EMF monitoring device 150 may temporarily shut down the well system operations and/or perform other remedial actions.

In some implementations, the controller unit 268 may also monitor the health state of the EMF monitoring device 150. The controller unit 268 may send notification signals to the indication panel 272 to trigger a visual and/or audible alert or notification (similarly as described above) to indicate any degradation in the health state of the EMF monitoring device 150. In some implementations, the controller unit 268 may monitor the health of the battery pack 284 and the overall health of the power module 280. In some implementations, the power supply 282 of the power module 280 may be an internal power supply (ISP) and the power may be supplied by the battery pack 284 (which, in one example, could be a twin battery back or any other type of battery pack). The battery pack 284 may be charged by the battery charger 286 that can be connected to any type of external main power supply 288, such as a single phase main (110/220V and 60 Hz), a 12V truck battery, among others. In some implementations, in addition to (or instead of) the battery power, the power module 280 may derive power directly from the external main power supply 288 (such as when the batteries are depleted). In some implementations, the controller unit 268 may detect and diagnose other internal faults in the EMF monitoring device 150, such as any faults in the signal conditioning unit 266 or the indication panel 272. In some implementations, in addition to (or instead of) providing notifications for low battery conditions or battery failure or other system or device health conditions, notifications for other issues, such as loss of communication with the headset or loss of communication with the ESP, may be provided to the indication panel 272 to trigger alerts and notifications. Thus, the EMF monitoring device 150 may detect various types of fault conditions in the well system (such as the well system 100), such as an EMF condition (including voltage and/or current conditions) and health state conditions (including device and/or system health conditions).

In some implementations, the HMI 270 may be the interface that the well personnel use to turn on, setup, configure, and turn off the EMF monitoring device 150. For example, the HMI 270 may include buttons, switches, and other input mechanisms. As another example, the HMI 270 may include a display, LEDs, and/or other output mechanisms. The HMI 270 may allow the configuration of the current or voltage sensing by manually or programmatically controlling the shorting or opening of the shorting circuit breaker 262. For example, the HMI 270 may allow personnel to manually change the settings, or may allow the personnel to program the controller unit 268 to automatically and continuously change the settings during the monitoring operations. In some implementations, the HMI 270 may be used for various other functions, such as to obtain direct readings of the voltages or currents in the ESP cable 115 and/or to allow motor impedances or resistances to be measured under the open-circuit configurations.

In some implementations, in addition to continuously monitoring the voltages and currents in the ESP cable 115 to detect EMF conditions, the EMF monitoring device 150 may continuously or periodically or intermittently monitor resistances in the ESP cable 115. For example, the EMF monitoring device 150 may monitor one or more phase-to-phase resistances and one or more phase-to-ground resistances in the ESP cable 115 to determine if electrical conditions have changed downhole, such as damage to the electrical insulation of the ESP cable 115 or other damage to the integrity of the ESP cable 115. In some implementations, similar to the current and voltage monitoring, the controller unit 268 may work in conjunction with the signal conditioning unit 266 to monitor the resistances. In some implementation, the EMF monitoring device 150 may include other devices or circuits that can work in conjunction with the controller unit 268 to detect the resistances and process the resistance measurements. For example, the other devices or circuits may isolate the ESP cable 115 from the other components of the EMF monitoring device 150 to perform the resistance measurements. In some implementations, the controller unit 268 may compare the measured resistances with one or more resistance thresholds or determine if the resistances are within acceptable ranges to determine if the electrical conditions have changed downhole, such as detecting damage to the ESP cable 115. In some implementations, the controller unit 268 may also cause the indication panel 272 to trigger alerts or notifications if the one or more resistances do not meet the thresholds or are outside the acceptable resistance ranges. It is noted, however, that in other implementations, the EMF monitoring device 150 may be used to monitor other aspects of the health of the ESP and alert the personnel of any degraded conditions. For example, the EMF monitoring device 150 may perform health checks of the ESP gauge, such as the annulus temperature, motor temperature, annulus pressure, and vibrations in the X and Y axis.

In some implementations, the EMF monitoring device 150 may log all the monitoring and detection data and measurements collected from the EMF monitoring and detection operations. For example, the EMF monitoring device 150 may include internal memory for the data logging, or the EMF monitoring device 150 may have slots or other input connectors to connect a memory card, USB memory stick, or other external memory devices for the data logging. In some implementations, the EMF monitoring device 150 may log the voltage and current measurements/values and the detected EMF conditions. The EMF monitoring device 150 may also log the time, date, and other supporting data associated with the voltage and current measurements and the detected EMF conditions. In some implementations, the monitoring and detection data, such as the voltage and current measurements and the detected EMF conditions, may be provided to a remote monitoring center for logging. In some implementations, the EMF monitoring device 150 may log additional information, such as the data collected from system health checks, such as the time stamp and result of power module health checks and the time stamp and results of electrical health and ESP gauge health and function tests.

Figure 3:
FIG. 3 is a flowchart of example operations for monitoring EMF for an ESP having a PMM, according to some implementations.
Figure 3:
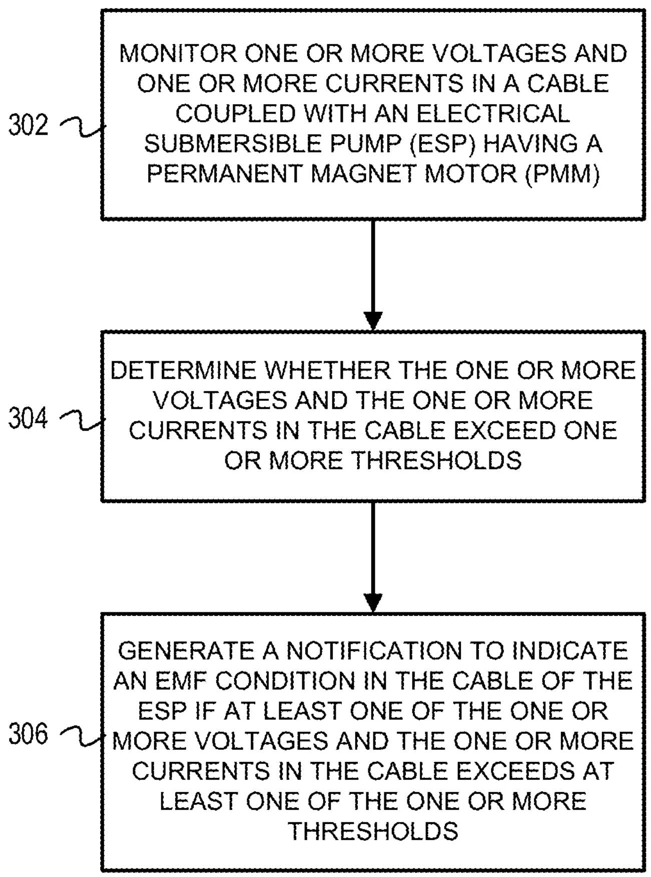

FIG. 3 is a flowchart 300 of example operations for monitoring EMF for an ESP having a PMM, according to some implementations. In some implementations, one or more voltages and one or more currents in a cable coupled to the ESP having the PMM may be monitored (block 302). In some implementations, it may be determined whether the one or more voltages and the one or more currents in the cable exceed one or more thresholds (block 304). In some implementations, a notification to indicate an EMF condition in the cable of the ESP is generated if at least one of the one or more voltages and the one or more currents in the cable exceeds at least one of the one or more thresholds (block 306). In some implementations, the EMF condition can be determined based on a voltage condition detected from the voltage measurements, based on a current condition detected from the current measurements, or based on both the voltage condition and the current condition (as further described above in FIGS. 1 and 2).

In some implementations, determining whether the one or more voltages and the one or more currents in the cable exceed one or more thresholds may include at least one of determining whether at least one of the one or more voltages in the cable exceeds a voltage threshold and determining whether at least one of the one or more currents in the cable exceeds a current threshold. In some implementations, generating the notification to indicate the EMF condition in the cable of the ESP may be in response to at least one of determining at least one of the one or more voltages in the cable exceeds the voltage threshold and determining at least one of the one or more currents in the cable exceeds the current threshold. In some implementations, monitoring one or more voltages and one or more currents in the cable coupled to the ESP may include continuously measuring the one or more voltage between conductors of the cable located downhole in a well and continuously measuring the one or more currents across each of the conductors of the cable located downhole in the well.

Figure 4:
FIG. 4 depicts an example controller unit and indication panel of the EMF monitoring device that can be implemented in a well system for monitoring EMF conditions for a PMM-based ESP, according to some implementations.
Figure 4:
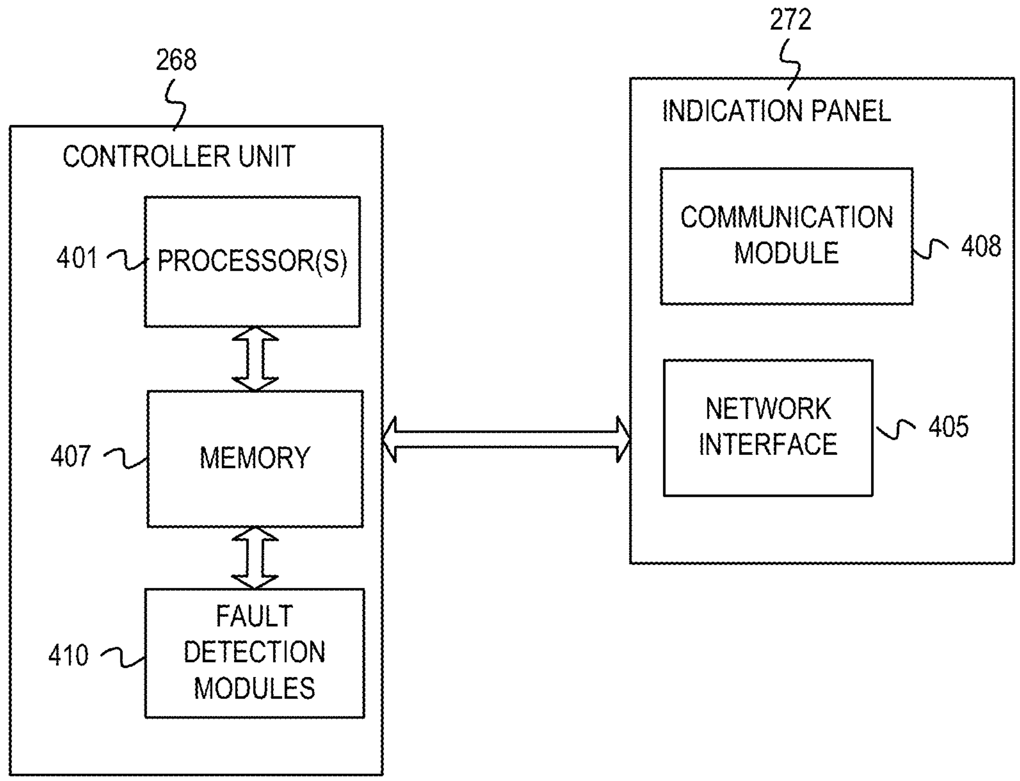

FIG. 4 depicts an example controller unit 268 and indication panel 272 of the EMF monitoring device 150 that can be implemented in a well system for monitoring EMF conditions for a PMM-based ESP, according to some implementations. The additional components of the EMF monitoring device 150 shown in FIG. 2 (such as the signal conditioning unit or the power module) are not shown for simplicity. The controller unit 268 may include one or more processors 401 (possibly including multiple cores, multiple nodes, and/or implementing multi-threading, etc.). The controller unit 268 may include memory 407. The memory 407 may be system memory or any type or implementation of machine or computer readable media having instructions that are executable by the one or more processors 401 to implement the operations described in FIGS. 1-3. The memory 407 may be system memory or any type or implementation of machine or computer readable and writable media having the ability to receive, process and/or store data, such as the voltage, current, and resistance measurements described in FIGS. 1-3. The control unit 268 may also include one or more data analysis and detection modules that are stored in the memory 407 and executable by the one or more processors 401, such as the fault detection module 410. The fault detection module 410 may analyze voltage, current and resistance signals (received from a signal conditioning unit), measure the voltage, current and resistance values, and compare the measurements to one or more thresholds to monitor and detect EMF conditions and monitor the health of the ESP cable and ESP, as described in FIGS. 1-2. The fault detection module 410 may also provide notification signals of a detected EMF condition (including voltage and/or current conditions) and/or the detected system or device health condition to the indication panel 272. The indication panel 272 may include a network interface 405 and a communications module 408 that may control wired and wireless communications (e.g., Ethernet, Wi-Fi, Bluetooth, GPS, and cellular, among others), such as wireless or wired signal notifications to one or more devices (e.g., such as a strobe light and headset) at the well site to alert or notify of an EMF condition at the well site, and remote wireless notifications to a remote monitoring center, as described in FIGS. 1-2. The functionality described herein may be implemented with an application-specific integrated circuit, in logic implemented in the processor(s) 401, in a co-processor on a peripheral device or card, etc. Further, implementations may include fewer or additional components not illustrated in FIG. 4.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine-readable medium(s) may be utilized. The machine-readable medium may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store a program for use by or in connection with an instruction execution system, apparatus, or device. A machine-readable storage medium is not a machine-readable signal medium.

A machine-readable signal medium may include a propagated data signal with machine-readable program code embodied therein, for example, in baseband or as part of a carrier wave. Such a propagated signal may take any of a variety of forms, including, but not limited to, electro-magnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine-readable medium that can direct a machine to function in a particular manner, such that the instructions stored in the machine-readable medium produce an article of manufacture including instructions which implement the function/act specified in the flowchart and/or block diagram block or blocks.

While the aspects of the disclosure are described with reference to various implementations and exploitations, it will be understood that these aspects are illustrative and that the scope of the claims is not limited to them. In general, techniques for monitoring EMF conditions of a PMM-based ESP as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

As used herein, the term "or" is inclusive unless otherwise explicitly noted. Thus, the phrase "at least one of A, B, or C" is satisfied by any element from the set {A, B, C} or any combination thereof, including multiples of any element.

Furthermore, unless otherwise specified, use of the terms "up," "upper," "upward," "uphole," "upstream," or other like terms shall be construed as generally away from the bottom, terminal end of a well; likewise, use of the terms "down," "lower," "downward," "downhole," or other like terms shall be construed as generally toward the bottom, terminal end of the well, regardless of the wellbore orientation. Use of any one or more of the foregoing terms shall not be construed as denoting positions along a perfectly vertical axis. In some instances, a part near the end of the well can be horizontal or even slightly directed upwards. Unless otherwise specified, use of the term "subterranean formation" shall be construed as encompassing both areas below exposed earth and areas below earth covered by water such as ocean or fresh water.

EXAMPLE EMBODIMENTS

Example Embodiments can include the following:

Embodiments #1: A method for monitoring an electromotive force (EMF) for an electrical submersible pump (ESP) having a permanent magnet motor (PMM), comprising: monitoring one or more voltages and one or more currents in a cable coupled to the ESP having the PMM; determining whether the one or more voltages and the one or more currents in the cable exceed one or more thresholds; and generating a notification to indicate an EMF condition in the cable of the ESP if at least one of the one or more voltages and the one or more currents in the cable exceeds at least one of the one or more thresholds.

Embodiments #2: The method of Embodiments #1, wherein determining whether the one or more voltages and the one or more currents in the cable exceed one or more thresholds includes at least one of: determining whether at least one of the one or more voltages in the cable exceeds a voltage threshold; and determining whether at least one of the one or more currents in the cable exceeds a current threshold.

Embodiments #3: The method of Embodiments #1, wherein generating the notification to indicate the EMF condition in the cable of the ESP is in response to at least one of: determining at least one of the one or more voltages in the cable exceeds a voltage threshold; and determining at least one of the one or more currents in the cable exceeds a current threshold.

Embodiments #4: The method of Embodiments #1, wherein monitoring one or more voltages and one or more currents in the cable coupled to the ESP includes: continuously measuring the one or more voltage between conductors of the cable located downhole in a well; and continuously measuring the one or more currents across each of the conductors of the cable located downhole in the well.

Embodiments #5: The method of Embodiments #1, wherein the notification to indicate the EMF condition includes a signal notification that causes an activation of one or more visual notification via one or more devices of the surface equipment at a well site and an activation of an audible notification to a wireless headset at the well site.

Embodiments #6: The method of Embodiments #1, wherein the notification to indicate the EMF condition includes a signal notification that causes an activation of one or more of a siren, a strobe light, an LED light, an alarm, and a vibration notification.

Embodiments #7: The method of Embodiments #1, wherein generating the notification to indicate the EMF condition includes generating a remote signal notification to a remote monitoring center indicating the EMF condition.

Embodiments #8: The method of Embodiments #1, further comprising: monitoring one or more resistances in the cable coupled to the ESP.

Embodiments #9: The method of Embodiments #8, wherein monitoring the one or more resistances in the cable coupled to the ESP includes at least one of: monitoring one or more phase-to-phase resistances in the cable; and monitoring one or more phase-to-ground resistances in the cable.

Embodiments #10: The method of Embodiments #1, further comprising: logging monitoring and detection data including voltage and current measurements and EMF condition detection events.

Embodiments #11: An electromotive force (EMF) monitoring device for an electrical submersible pump (ESP) having a permanent magnet motor (PMM), comprising: one or more voltage and current sensing devices configured to monitoring one or more voltages and one or more currents in a cable coupled to the ESP having the PMM; one or more processors; and a computer-readable storage medium having instructions stored thereon that are executable by the one or more processors to cause the EMF monitoring device to: determine whether the one or more voltages and the one or more currents in the cable exceed one or more thresholds; and generate a notification to indicate an EMF condition in the cable of the ESP if at least one of the one or more voltages and the one or more currents in the cable exceeds at least one of the one or more thresholds.

Embodiments #12: The EMF monitoring device of Embodiments #11, wherein the instructions that cause the EMF monitoring device to determine whether the one or more voltages and the one or more currents in the cable exceed one or more thresholds include at least one of: instructions that cause the EMF monitoring device to determine whether at least one of the one or more voltages in the cable exceeds a voltage threshold; and instructions that cause the EMF monitoring device to determine whether at least one of the one or more currents in the cable exceeds a current threshold.

Embodiments #13: The EMF monitoring device of Embodiments #11, wherein the instructions that cause the EMF monitoring device to generate the notification to indicate the EMF condition in the cable of the ESP is in response to determining one or more of: at least one of the one or more voltages in the cable exceeding a voltage threshold; and at least one of the one or more currents in the cable exceeding a current threshold.

Embodiments #14: The EMF monitoring device of Embodiments #11, wherein the notification to indicate the EMF condition includes a signal notification that causes an activation of one or more visual notification via one or more devices of the surface equipment at a well site and an activation of an audible notification to a wireless headset at the well site.

Embodiments #15: The EMF monitoring device of Embodiments #11, further comprising: instructions that cause the EMF monitoring device to monitor one or more resistances in the cable coupled to the ESP.

Embodiments #16: The EMF monitoring device of Embodiments #11, further comprising: instructions that cause the EMF monitoring device to log monitoring and detection data including voltage and current measurements and EMF condition detection events.

Embodiments #17: A non-transitory computer-readable storage medium having instructions stored thereon that are executable by one or more processors of an electromotive force (EMF) monitoring device for an electrical submersible pump (ESP) having a permanent magnet motor (PMM), the instructions comprising: instructions for monitoring one or more voltages and one or more currents in a cable coupled to the ESP having the PMM; instructions for determining whether the one or more voltages and the one or more currents in the cable exceed one or more thresholds; and instructions for generating a notification to indicate an EMF condition in the cable of the ESP if at least one of the one or more voltages and the one or more currents in the cable exceeds at least one of the one or more thresholds.

Embodiments #18: The non-transitory computer-readable storage medium of Embodiments #17, wherein the instructions for determining whether the one or more voltages and the one or more currents in the cable exceed one or more thresholds include at least one of: instructions for determining whether at least one of the one or more voltages in the cable exceeds a voltage threshold; and instructions for determining whether at least one of the one or more currents in the cable exceeds a current threshold.

Embodiments #19: The non-transitory computer-readable storage medium of Embodiments #17, wherein the instructions for generating the notification to indicate the EMF condition in the cable of the ESP is in response to determining one or more of: at least one of the one or more voltages in the cable exceeding a voltage threshold; and at least one of the one or more currents in the cable exceeding a current threshold.

Embodiments #20: The non-transitory computer-readable storage medium of Embodiments #17, further comprising: instructions for monitoring one or more resistances in the cable coupled to the ESP.

What is claimed is:

1. A method for monitoring an electromotive force (EMF) for an electrical submersible pump (ESP) having a permanent magnet motor (PMM), comprising:

monitoring one or more voltages and one or more currents in a plurality of conductors and a cable armor grounding strap of a cable coupled to the ESP having the PMM;

determining whether the one or more voltages and the one or more currents in the cable exceed one or more thresholds; and generating a notification to indicate an EMF condition in the cable of the ESP if at least one of the one or more voltages and the one or more currents in the cable exceeds at least one of the one or more thresholds.

2. The method of claim 1, wherein determining whether the one or more voltages and the one or more currents in the cable exceed one or more thresholds includes at least one of:

determining whether at least one of the one or more voltages in the cable exceeds a voltage threshold; and determining whether at least one of the one or more currents in the cable exceeds a current threshold.

3. The method of claim 1, wherein generating the notification to indicate the EMF condition in the cable of the ESP is in response to at least one of:

determining at least one of the one or more voltages in the cable exceeds a voltage threshold; and determining at least one of the one or more currents in the cable exceeds a current threshold.

4. The method of claim 1, wherein monitoring the one or more voltages and the one or more currents in the plurality of conductors and the cable armor grounding strap of the cable coupled to the ESP includes:

continuously measuring the one or more voltage between the plurality of conductors and the cable armor grounding strap of the cable located downhole in a well; and continuously measuring the one or more currents across each of the plurality of conductors and the cable armor grounding strap of the cable located downhole in the well.

5. The method of claim 1, wherein the notification to indicate the EMF condition includes a signal notification that causes an activation of one or more visual notification via one or more devices of surface equipment at a well site and an activation of an audible notification to a wireless headset at the well site.

6. The method of claim 1, wherein the notification to indicate the EMF condition includes a signal notification that causes an activation of one or more of a siren, a strobe light, an LED light, an alarm, and a vibration notification.

7. The method of claim 1, wherein generating the notification to indicate the EMF condition includes generating a remote signal notification to a remote monitoring center indicating the EMF condition.

8. The method of claim 1, further comprising:

monitoring one or more resistances in the cable coupled to the ESP.

9. The method of claim 8, wherein monitoring the one or more resistances in the cable coupled to the ESP includes:

monitoring one or more phase-to-phase resistances in the cable; and monitoring one or more phase-to-ground resistances in the cable.

10. The method of claim 1, further comprising:

logging monitoring and detection data including voltage and current measurements and EMF condition detection events.

11. The method of claim 1, further comprising:

in response to determining the EMF condition in the cable of the ESP, locking out a cable reel of the cable coupled to the ESP to stop well operations including at least one of stopping deployment operations of the ESP or stopping removal operations of the ESP.

12. An electromotive force (EMF) monitoring device for an electrical submersible pump (ESP) having a permanent magnet motor (PMM), comprising:

one or more voltage and current sensing devices configured to monitor one or more voltages and one or more currents in a plurality of conductors and a cable armor grounding strap of a cable coupled to the ESP having the PMM;

one or more processors; and a computer-readable storage medium having instructions stored thereon that are executable by the one or more processors to cause the EMF monitoring device to:

determine whether the one or more voltages and the one or more currents in the cable exceed one or more thresholds; and generate a notification to indicate an EMF condition in the cable of the ESP if at least one of the one or more voltages and the one or more currents in the cable exceeds at least one of the one or more thresholds.

13. The EMF monitoring device of claim 12, wherein the instructions that cause the EMF monitoring device to determine whether the one or more voltages and the one or more currents in the cable exceed one or more thresholds include at least one of:

instructions that cause the EMF monitoring device to determine whether at least one of the one or more voltages in the cable exceeds a voltage threshold; and instructions that cause the EMF monitoring device to determine whether at least one of the one or more currents in the cable exceeds a current threshold.

14. The EMF monitoring device of claim 12, wherein the instructions that cause the EMF monitoring device to generate the notification to indicate the EMF condition in the cable of the ESP is in response to determining one or more of:

at least one of the one or more voltages in the cable exceeding a voltage threshold; and at least one of the one or more currents in the cable exceeding a current threshold.

15. The EMF monitoring device of claim 12, wherein the notification to indicate the EMF condition includes a signal notification that causes an activation of one or more visual notification via one or more devices of surface equipment at a well site and an activation of an audible notification to a wireless headset at the well site.

16. The EMF monitoring device of claim 12, further comprising:

instructions that cause the EMF monitoring device to monitor one or more phase-to-phase resistances and one or more phase-to-ground resistances in the cable coupled to the ESP.

17. The EMF monitoring device of claim 12, further comprising:

instructions that cause the EMF monitoring device to log monitoring and detection data including voltage and current measurements and EMF condition detection events.

18. A non-transitory computer-readable storage medium having instructions stored thereon that are executable by one or more processors of an electromotive force (EMF) monitoring device for an electrical submersible pump (ESP) having a permanent magnet motor (PMM), the instructions comprising:

instructions for monitoring one or more voltages and one or more currents in a plurality of conductors and a cable armor grounding strap of a cable coupled to the ESP having the PMM;

instructions for determining whether the one or more voltages and the one or more currents in the cable exceed one or more thresholds; and instructions for generating a notification to indicate an EMF condition in the cable of the ESP if at least one of the one or more voltages and the one or more currents in the cable exceeds at least one of the one or more thresholds.

19. The non-transitory computer-readable storage medium of claim 18, wherein the instructions for determining whether the one or more voltages and the one or more currents in the cable exceed one or more thresholds include at least one of:

instructions for determining whether at least one of the one or more voltages in the cable exceeds a voltage threshold; and instructions for determining whether at least one of the one or more currents in the cable exceeds a current threshold.

20. The non-transitory computer-readable storage medium of claim 18, wherein the instructions for generating the notification to indicate the EMF condition in the cable of the ESP is in response to determining one or more of:

at least one of the one or more voltages in the cable exceeding a voltage threshold; and at least one of the one or more currents in the cable exceeding a current threshold.

21. The non-transitory computer-readable storage medium of claim 18, further comprising:

instructions for monitoring one or more phase-to-phase resistances and one or more phase-to-ground resistances in the cable coupled to the ESP.

* * * * *